(12) United States Patent
Bollinger et al.

(10) Patent No.: US 6,955,991 B2
(45) Date of Patent: *Oct. 18, 2005

(54) ATMOSPHERIC PROCESS AND SYSTEM FOR CONTROLLED AND RAPID REMOVAL OF POLYMERS FROM HIGH DEPTH TO WIDTH ASPECT RATIO HOLES

(75) Inventors: Lynn David Bollinger, Ridgefield, CT (US); Iskander Tokmouline, New Fairfield, CT (US)

(73) Assignee: Jetek, Inc., Ridgefield, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/359,326

(22) Filed: Feb. 6, 2003

(65) Prior Publication Data

US 2004/0005785 A1 Jan. 8, 2004

Related U.S. Application Data

(63) Continuation-in-part of application No. 09/693,117, filed on Oct. 20, 2000, which is a continuation of application No. PCT/US00/27113, filed on Sep. 28, 2000.
(60) Provisional application No. 60/162,762, filed on Nov. 1, 1999.

(51) Int. Cl.[7] .......................... H01L 21/47; H01L 21/465
(52) U.S. Cl. ....................... 438/725; 438/730; 438/795; 216/67; 250/492.2
(58) Field of Search ............................. 216/58, 59, 63, 216/67, 81; 438/710, 715, 716, 729, 730, 795, 725; 250/492.2

(56) References Cited

U.S. PATENT DOCUMENTS

| 4,783,695 | A | | 11/1988 | Eichelberger et al. ........ 357/65 |
|---|---|---|---|---|
| 5,302,547 | A | | 4/1994 | Wojnarowski et al. ...... 437/173 |
| 5,314,709 | A | | 5/1994 | Doany et al. .................. 427/96 |
| 5,830,376 | A | | 11/1998 | Bohlke et al. ................. 216/65 |
| 5,968,283 | A | | 10/1999 | Walraven et al. ............. 134/19 |
| 6,057,247 | A | * | 5/2000 | Imai et al. .................... 438/714 |
| 6,467,297 | B1 | * | 10/2002 | Bollinger et al. ............. 62/404 |
| 6,492,613 | B2 | * | 12/2002 | Bollinger et al. ....... 219/121.54 |
| 6,582,617 | B1 | * | 6/2003 | Pong ............................ 216/49 |
| 2002/0030038 | A1 | * | 3/2002 | Bollnger et al. ....... 219/121.54 |
| 2004/0005785 | A1 | * | 1/2004 | Bollinger et al. ............ 438/710 |
| 2004/0055995 | A1 | * | 3/2004 | Westerman et al. ............ 216/2 |
| 2004/0097077 | A1 | * | 5/2004 | Nallan et al. ................ 438/689 |

FOREIGN PATENT DOCUMENTS

| WO | WO 01/23130 | * | 4/2001 | .......... B23K/10/00 |
|---|---|---|---|---|

OTHER PUBLICATIONS

PCT International Search Report mailed on Nov. 28, 2000 for copending International Patent Application PCT/US00/27113.

* cited by examiner

Primary Examiner—M. Wilczewski
(74) Attorney, Agent, or Firm—St. Onge Steward Johnston & Reens

(57) ABSTRACT

A hot arc-type plasma generating system is described to etch a polymer on a substrate used in the manufacture of semiconductor devices. The etching process is particularly useful to remove a polymer from high aspect ratio holes, that can include trenches, greater than about 10 to 1 and even greater than 50 to 1.

12 Claims, 2 Drawing Sheets

ATMOSPHERIC PROCESS AND SYSTEM FOR CONTROLLED AND RAPID REMOVAL OF POLYMERS FROM HIGH DEPTH TO WIDTH ASPECT RATIO HOLES

PRIOR APPLICATIONS

This application is a CIP of Copending Nonprovisional patent application Ser. No. 09/693,117 filed Oct. 20, 2000 entitled "Method For Rapid Thermal Processing", filed by Lynn David Bollinger and Iskander Tokmouline and assigned to the same assignee as this invention, which is a continuation under 35 USC 120 of International Patent Application PCT/US00/27113, entitled "Atmospheric Process And System For Controlled And Rapid Removal of Polymers From High Depth To Width Ratio Holes", bearing an international filing date of 28 Sep., 2000, published in English on 5 Apr., 2001 as WO 01/23130 A1 which in turn claims priority based upon a provisional application No. 60/162,762 filed Nov. 1, 1999, and further having all been filed by the same inventors and assigned to the same assignee as of this patent application.

FIELD OF THE INVENTION

This invention relates to semiconductor manufacturing generally and more specifically to a step in the process of manufacturing semiconductor devices using a hot gas stream technique.

BACKGROUND OF THE INVENTION

Holes and trench like patterns with a very high depth to width aspect ratio with micron or sub-micron openings have a number of applications in the manufacture of semiconductors. This description uses the term high aspect ratio holes to generically describe holes and trench like patterns that have a very high depth to width ratio of greater than 10 to 1. Various etching methods have been developed to generate such holes in silicon. The approaches use a lithographically defined mask pattern; wet chemical etch methods that take advantage of chemical selectivity along the crystal plane; and dry, plasma etch processes, which are done at low pressure to obtain a highly directional, anisotropic etch.

Very high aspect ratio holes have an application in semiconductor devices and in various miniature micro-machined devices (MIMMs). In semiconductor DRAM devices trenches for high capacitance structures with low surface area having aspect ratios of 50:1 and higher are being investigated for advanced designs. For both semiconductor and MIMMs devices, the need for subsequent patterning after making the very high aspect ratio holes usually requires a photolithographically defined mask pattern be made in a photosensitive polymer such as photoresist or photosensitive polyimide. In such a step, the high aspect ratio hole is filled with the photosensitive polymer.

Following the processes that use the polymer mask pattern, the polymer mask must be stripped from the device. In some applications, it may be advantageous to remove the polymer material partially, to a controlled depth to allow processing the upper, exposed section of the hole while the remaining polymer protects the lower section in the holes. A DRAM capacitor application that uses such a capability to increase the capacitor's area is described in "New Materials Enhance Memory Performance" a review by J. Baliga, Semiconductor International, November 1999, p 79–90, see p. 80.

Particularly for semiconductor applications, an additional requirement of the polymer removal process is that the exposed surface of the device not be subject to electrical degradation. Types of degradation that can occur in plasma removal processes may come from energetic species causing crystal damage or damage to a thin dielectric layer.

Standard methods of removing photo-polymers involve a method referred to as "ashing" in which a low pressure electrical discharge generates a plasma that creates chemically reactive oxygen species that flow to the surface to strip off the polymer and convert the polymer to volatile oxide by-products (e.g., $HO_x$, $CO_x$). For very high aspect ratio holes, the flux of active oxygen species, that reaches the bottom of the hole, decreases as the aspect ratio increases, with the result that the etch rate of the polymer slows dramatically. One means to avoid this is to use a High Density Plasma (HDP). In this process, an intense plasma is generated at a low pressure. This pressure is sufficiently low so that the path length between collisions of plasma generated reactive species is sufficiently long so that reactive ions can be injected into the hole by acceleration of an electric field set-up in a boundary layer "sheath" over the surface of the substrate. A problem with this HDP approach is that the energetic ion species can electrically degrade the device's electrical characteristics.

The prior art has used the concept of a long path length between collisions with other gas species to enable a reactive species to reach the bottom of a very high aspect ratio hole where the species can convert the polymer to volatile by-products.

SUMMARY OF THE INVENTION

In our invention we describe the use of a near atmospheric pressure process that enables removal of a polymer from high aspect ratio holes, including trenches, without electrical degradation. These holes in substrates may have depth to width ratios greater than 10:1 including very narrow widths that can be less than 0.1 micron. With this invention a controlled, partial removal of the polymer from high aspect ratio holes can be done without electrical degradation of sensitive devices that may be on the substrate. The polymers may be removed at relatively high rates, >5 microns/min. The polymers may be standard, photo-resists or highly cross-linked polymers such as polyimide that are very difficult to remove by any standard wet or dry plasma techniques.

This is achieved with one technique according to the invention with the use of a system for generating a near atmospheric flow of a hot gas stream to the wafer substrate surface from which polymer is to be removed from high aspect ratio holes. The hot gas stream typically has a smaller area than the substrate so that controlled motion of the substrate through the hot gas stream is used to uniformly remove polymer from the substrate. The hot gas stream is a high temperature arc type plasma that is generated in an inert gas such as argon. The combined effect of ashing, i.e. the reaction of oxygen with the polymer to form volatile products, and ablation, discussed further in the following specification, enable a controlled removal of the polymer from high aspect ratio holes.

It is, therefore, an object of the invention to provide a technique for the removal of a polymer from a high aspect ratio hole in a semiconductor wafer or other substrate surface.

These and other advantages and objects of the invention can be understood from the following detailed description of an embodiment as shown in the drawings.

DETAILED DESCRIPTION OF THE DRAWINGS

Figure 1:
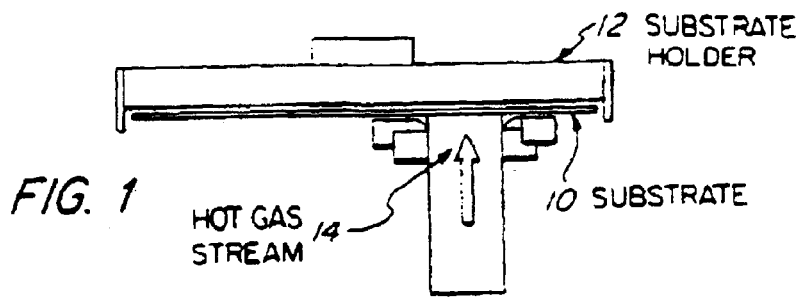
FIG. 1 is a schematic side plan view of an apparatus showing the concept of using a hot gas stream for the removal or controlled partial removal of a polymer in accordance with the invention from high aspect ratio holes in a semiconductor wafer substrate surface.
Figure 2:
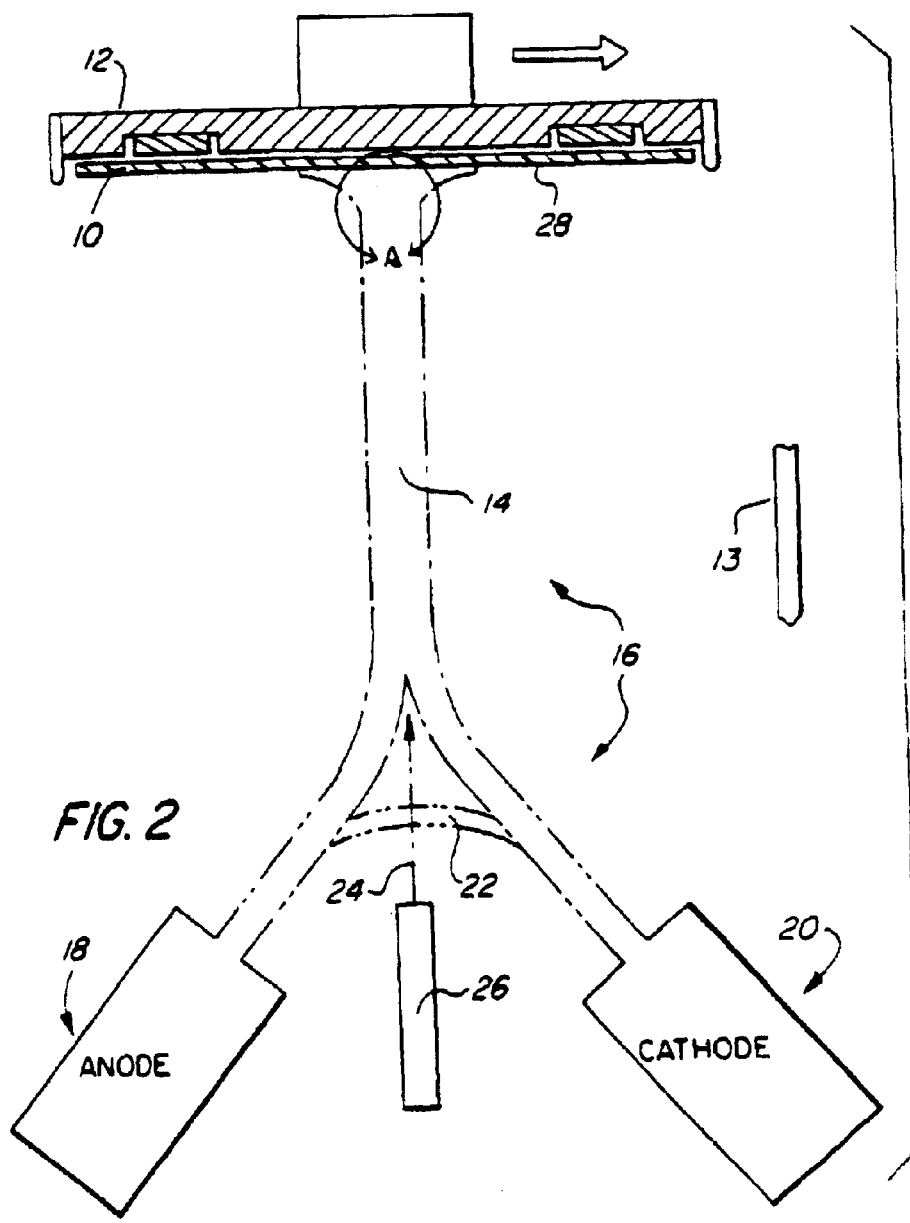
FIG. 2 is a schematic side plan view of a plasma processing system that can be used to generate the needed hot gas stream.

With reference to FIGS. 1 and 2 a semiconductor wafer 10 is shown mounted on a wafer holder 12. A hot gas stream 14 is directed onto the substrate or wafer surface. The wafer 10 is held in an upside down position with the assistance of a negative pressure from a flow of gas such as nitrogen. The wafer holder 12 and technique for retaining a wafer can be as described in a co-pending provisional patent application entitled "Wafer Holder For Rotating and Translating Wafers For Processing In An Atmospheric plasma System With Control Of Wafer Holder Temperature" filed on Oct. 12, 1999 bearing Ser. No. 60/158,892 by the same inventors and owner as for this patent application and which provisional application is fully incorporated herein by reference thereto.

With reference to FIG. 2, an atmospheric hot gas stream 14 is generated with an apparatus 16 within a sealed chamber 13. The atmospheric plasma generating system 16, often referred to as a plasma jet, has previously been described, see U.S. Pat. No. 6,040,548, by Siniaguine, entitled "Apparatus for generating and deflecting a plasma jet". Additional improvements to the apparatus described in U.S. Pat. No. 6,040,548 for this polymer removal application are described and referenced in the description of this application.

The apparatus 16 uses a high temperature, arc type plasma generated in an inert gas such as argon between two electrode subassemblies 18, 20 that serve as a cathode and anode for the arc discharge 22. As shown in FIG. 2, the arc 22 formed by the electrode configuration creates the stream 14 of hot gas to the substrate surface 28. The substrate or wafer 10 to be processed is moved through the treatment area formed by the hot gas stream 14 using a suitable actuator that is not shown. Other suitable ambient gases may be employed inside the sealed chamber 13.

A gas injector 26 may be used to inject a gas such as oxygen or a mixture of gasses directly into the hot gas stream. Without a flow of gas from the gas injector 26, the hot gas stream is composed primarily of the inert gas from the two electrode assemblies and from the process chamber 13 ambient gas that is entrained into the hot gas stream. For a polymer removal process, the temperature of the gas stream at the hydrodynamic gas boundary over the wafer surface 28 may typically be approximately 8,000° C. This temperature may be controlled by controlling the distance of the electrode assemblies 18, 20 from the substrate 10 and the power into the arc type plasma. Typical power parameters for driving the arc plasma are approximately 150 V and 80 A.

The size of the treatment area generally denoted as A, where the stream 14 is incident upon the substrate surface 28, is approximately 2 cm diameter, normally less than the size of the substrate 10 to be processed (e.g., a 200 mm diameter silicon wafer). Consequently, the entire substrate surface 28 is treated by multiple passes of the wafer 10 through the treatment area using a motion configuration that provides for treatment over the full wafer area. The relative motion of the wafer with respect to the treatment area is programmed so that uniform treatment can be obtained. Motion configurations can be by way of step and scan or by way of rotation with translation of wafer 10.

The depth of polymer removed from a local area of a substrate as it passes through the hot gas stream depends on the time that the area spends in the hot gas stream and, consequently, on the velocity of that local area through the gas stream. For example, if a rotation and translation motion configuration is used with a constant rotational velocity, a local area of the wafer has a rotational velocity that increases with radial distance R from the center of rotation. To achieve uniform polymer removal over the full substrate, the translation velocity of the wafer through the hot gas stream must then be a function of distance from the center of rotation to account for this increase in radial velocity. To a first approximation, the translation velocity will have a 1/R dependence. In practice, the programmed velocity may be adjusted in an iterative procedure based on a measurement after a partial polymer removal that gives a mapping of the variation of the thickness of the polymer removed from uniform removal. The local velocities of the wafer through the hot gas stream is then adjusted to compensate for the measured thickness variation. A procedure for iteratively adjusting the velocity for a treating a batch of wafers using planetary motion configuration is described in the international patent WO9745856 entitled "Method for treating articles in a plasma jet," inventors Tokmouline and Siniaguine.

As described in the above paragraph, the depth of polymer removed from a local area as it moves through the hot gas stream depends on the velocity of the local area through the gas stream. Velocities may be in the range of 0.01 to 10 meters/sec. An example of a polymer removal process would be for a 200 mm diameter wafer with a rotation and translation motion configuration in which the time averaged polymer removal rate is 5 microns/min and the average translation velocity of a pass through the hot gas stream is 0.5 m/sec. Including the time the wafer spends out of the hot gas stream, the time of a pass through the hot gas stream would be approximately 0.5 sec. In a single pass 0.042 microns of polymer would be removed. To remove 2 microns of polymer, 48 passes would be needed. The number of passes of the substrate through the hot gas stream can then be used to control the depth of the polymer removed. In the above example, 0.5 microns would be removed with 12 passes. In practice, when polymer is removed from very narrow, very high aspect ratio holes there may be a dependence of removal rate with depth into the hole. This dependence can be measured and compensated for by adjusting the number of passes.

Two fundamental differences between our atmospheric process, and, the prior art ashing and HDP processes are: (1) the gas temperature is high and in thermal equilibrium in the etching gas stream; and (2) the arc generated plasma and process gas stream are highly collision dominated. In the prior art low pressure plasma applications, the atomic and molecular species are near room temperature (e.g., 100° C.) while the electrons are very energetic (e.g., 5 eV, ~50,000°

K.). In the gas stream 14 of an atmospheric system 16 in accordance with the invention as shown in FIGS. 1 and 2, the atomic and molecular species are in thermal equilibrium with the electrons with the gas stream temperature being in the range of 4000° C. to 12,000° C. and preferably in the range of 7,000° to 10,000° C.

Because the atmospheric hot gas stream is highly collision dominated, the mass and energy transport is described by hydrodynamic flow characteristics. In the atmospheric system, within the region A at the boundary between the stream of hot gas and the substrate, there is a hydrodynamic boundary. There can be a large temperature differential across the boundary; on the gas streamside, the gas temperature may be 8,000° C. while the wafer temperature may only be 100° C. Known hydrodynamic boundary layer characteristics applied to this application and described in the following paragraph show, that while the gas temperature defined by the atoms and ions drop to the substrate temperature at the surface of the substrate (e.g., 100° C.), the electrons can maintain considerably more energy at the substrate surface (e.g., 0.7 eV or ~6,000° C.). With this energy the electrons can locally generate species at the substrate that will contribute to etching in deep holes.

The temperature of the heavy species, primarily atoms and ions of mass $M_{atom}$, decrease smoothly from the temperature of the incoming gas flow (e.g., 8000° C.) down to the substrate surface temperature (e.g., 100° C.). The boundary layer thickness, $\delta$, is $\delta \sim 10^4$ m and the boundary thickness over which the significant part of the temperature change occurs is $0.01\delta \sim 10^{-6}$ m. Compared to collisions between heavy species, electrons, because of their relatively light mass, $M_e$, transfer only a small part of their kinetic energy per collision with a heavy species, a factor of $M_e/M_{atom} \sim 10^{-5}$. Consequently, over such a small distance, electrons cannot transfer a major part of their energy while traversing the boundary layer.

For polymer removal application, the stream 14 of hot gas to the substrate that is generated by an atmospheric plasma consists of inert gas from the arc and process chamber ambient gas pulled or entrained into the stream and, optionally, gas injected directly into the hot gas stream by a gas injector 26. The stream of hot gas to the substrate can remove the polymer by two mechanisms:

1. An ashing mechanism in which thermally created active oxygen species react with the polymer to form volatile by-products.

2. An ablation mechanism in which the flow of hot gas to the substrate surface 28 vaporizes clusters of molecules from the polymer surface which are subsequently converted to volatile by-products by reaction with the ambient oxygen in the process chamber 13 surrounding the apparatus 16. The ablation process is an interaction with the top monolayers of the polymer layer and it can carry away a significant amount of heat from the polymer surface 28 so that the remaining polymer layer is not thermally degraded.

The above two mechanisms act in synergism. The heat flux to the surface may accelerate the ashing mechanism and the heat generated by the ashing mechanism tend to accelerate ablation.

Figure 3:
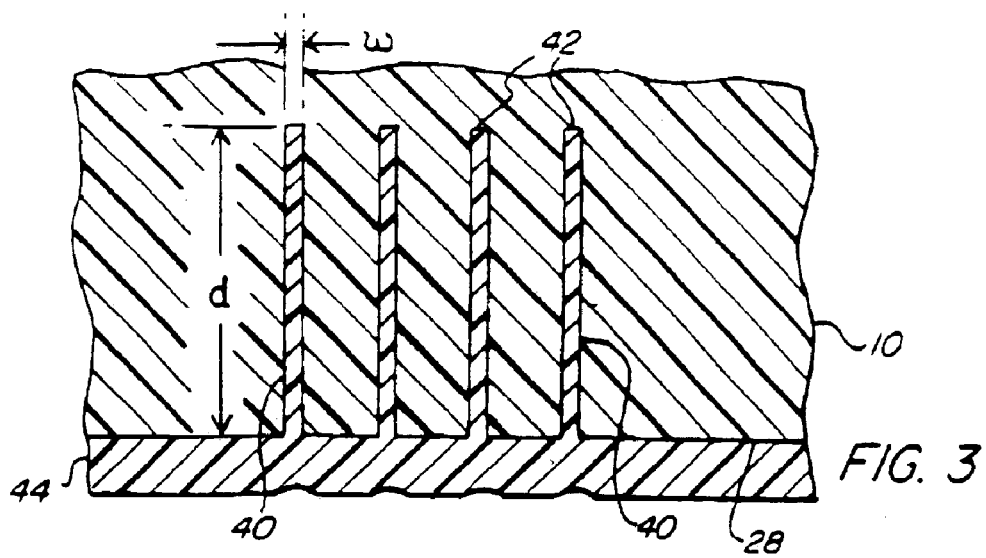
FIG. 3 is an enlarged section view of a semiconductor wafer substrate having high aspect ratio holes covered by a polymer during manufacture.

The atmospheric pressure approach for removal of polymers in high aspect ratio holes is particularly effective in comparison with conventional low pressure ashing and HDP processes, as described above. It is recognized that to remove polymer from very high aspect ratio holes as illustrated at 40 in FIGS. 2–4 the pressure must be sufficiently low for reactive species to reach the bottom 42 of the holes 40 without being affected by collisions with other atomic or molecular species. In an atmospheric hot gas technique in accordance with the invention, the transport of the etching species into the high aspect ratio hole is by way of a flow of collision dominated gas. Results show that the polymer 44 can be removed from trenches or holes 40 having a 50:1 aspect ratio, with a width w of less than 0.1 micron, with little effect on the etching rate of the polymer 44 even near the bottom 42 of the hole 40. Results show no limit as to obtaining similar control of polymer removal from even higher aspect ratio holes.

Figure 4:
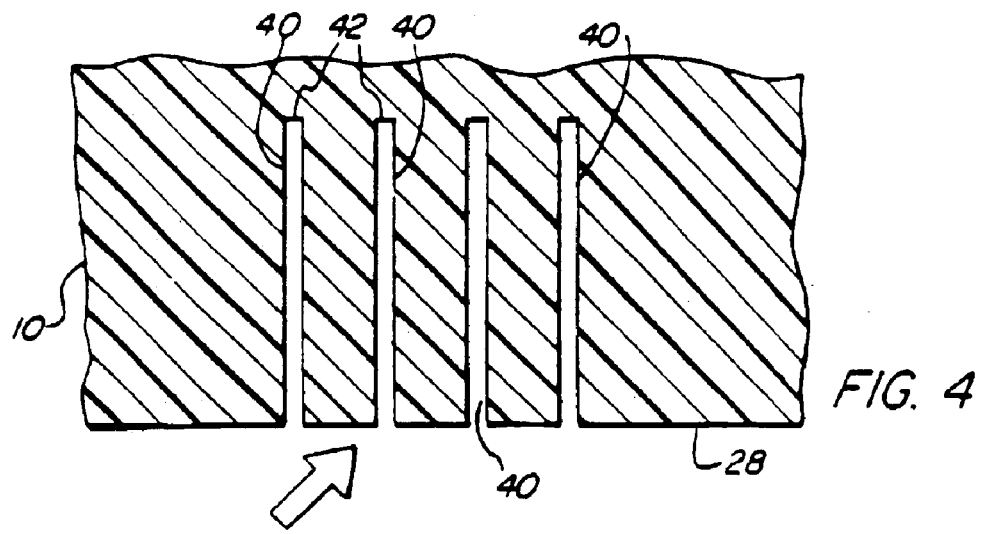
FIG. 4 is an enlarged section view of a semiconductor wafer substrate as in FIG. 2 with the polymer removed using the technique of our invention.
Figure 5:
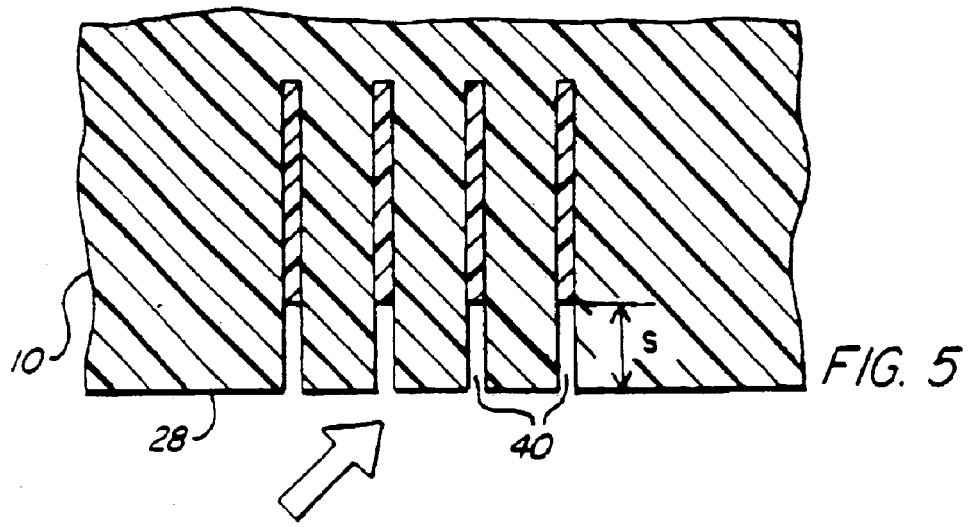
FIG. 5 is an enlarged section view of a semiconductor wafer substrate as in FIG. 2 but with the polymer partially removed using the technique of our invention.

For the application of controlled removal of the polymer 40 from high aspect ratio holes 40 as shown in FIG. 4, the process of this invention must uniformly remove the photoresist 44 from the holes 40 to a controlled depth S as well as maintain a high etch rate so as not to drive up the process cost. Obtaining uniform removal of photoresist is further complicated by the temperature dependence of the etch rate. The etch rate for photoresist and other polymers increases with temperature. For applications of removal of polymer to a controlled depth, rather than a complete stripping of the polymer, temperature control and uniformity of removal are necessary.

The above identified Provisional Patent application No. 60/158,892 describes a wafer holder and wafer motion configuration in which a rotating wafer is translated through the treatment area so that one can cause average wafer holder dependent thermal variations to be constant for a given radius. This provides axial symmetry to the temperature dependence. As described in the above identified 158,892 patent application, programmed motion of the center axis of a rotating wafer is used to establish uniform treatment of the wafer. For the temperature dependent photoresist removal application, the programmed motion of the wafer is used to compensate for thermal etch rate effects. In addition, the 158,892 application describes the use of a direct fluid cooled wafer holder with temperature feed-back to maintain the wafer holder at a constant temperature during processing.

Having thus described the hot gas process and a means of using an atmospheric plasma for generating the required hot gas stream to remove a polymer from a substrate device, the various advantages of the invention can be understood. Variations from the described process can be made by one skilled in the art without departing from the scope of the invention as set forth by the following claims.

What is claimed is:

1. A method for removing a polymer from a substrate having high aspect ratio holes having a depth to width aspect ratio of greater that 10:1, comprising the step of:

generating a hot gas stream and directing the stream at the substrate while it is exposed to atmospheric pressure for a time period and with a sufficient number of passes to remove the polymer from the holes to a desired depth.

2. The method as claimed in claim 1 wherein said generating step generates the stream of gas with a temperature in the range of between about 4000° C. and about 12,000° C.

3. The method as claimed in claim 2 wherein said generating step generates the stream of gas with a temperature in the range from about 7000° C. to about 10,000° C.

4. The method for removing a polymer as claimed in claim 1 wherein said step of generating the hot gas stream comprises the step of:

generating an atmospheric arc-type plasma stream between an anode and a cathode and
    directing the plasma at the polymer on the substrate.

5. The method for removing a polymer as claimed in claim 4 and further including the step of moving the substrate past the plasma stream at a speed and with a number of passes selected to remove a desired amount of polymer from the substrate.

6. The method as claimed in claim 1 wherein the substrate has a plurality of high aspect ratio holes and wherein said generated hot gas stream is directed at the substrate so as to remove the polymer from the high aspect ratio holes at a high etch rate.

7. The method for removing a polymer as claimed in claim 1 wherein said generated hot gas stream is directed at the substrate and the number of passes are selected so as to partially remove the polymer from the high aspect ratio holes to a controlled, desired depth.

8. The method as claimed in claim 1 wherein said polymer is a photoresist.

9. The method as claimed in claim 1 wherein said atmospheric hot gas stream includes ambient air.

10. The method as claimed in claim 1 wherein the hot gas stream is produced inside a sealed chamber and wherein the ambient atmosphere inside the chamber is formed with a gas that is injected into the chamber.

11. The method for removing a polymer as claimed in claim 1 wherein a gas is injected directly into the hot gas stream that is directed at the substrate.

12. The method for removing a polymer as claimed in claim 1 wherein the hot gas stream defines an etching area near the substrate and further including the step of moving the substrate along a programmed motion with respect to the etching to control a partial depth removal of the polymer across the substrate.

* * * * *